United States Patent
Mantik et al.

(10) Patent No.: US 7,594,207 B2
(45) Date of Patent: Sep. 22, 2009

(54) COMPUTATIONALLY EFFICIENT DESIGN RULE CHECKING FOR CIRCUIT INTERCONNECT ROUTING DESIGN

(75) Inventors: Stefanus Mantik, San Jose, CA (US); Limin He, Saratoga, CA (US); Soohong Kim, Pleasanton, CA (US); Jimmy Lam, Cupertino, CA (US); Jianmin Li, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 451 days.

(21) Appl. No.: 11/521,270

(22) Filed: Sep. 13, 2006

(65) Prior Publication Data

US 2008/0066027 A1 Mar. 13, 2008

(51) Int. Cl.
*G06F 17/50* (2006.01)
(52) U.S. Cl. .................. 716/4; 716/5; 716/12
(58) Field of Classification Search ........... 716/1, 716/4–5, 10–14
See application file for complete search history.

(56) References Cited

U.S. PATENT DOCUMENTS

| | | | |
|---|---|---|---|
| 2003/0229412 A1* | 12/2003 | White et al. | 700/121 |
| 2006/0095883 A1* | 5/2006 | Lakshmanan et al. | 716/11 |
| 2006/0236018 A1* | 10/2006 | Dao et al. | 710/317 |
| 2008/0033876 A1* | 2/2008 | Goldman et al. | 705/42 |
| 2008/0212876 A1* | 9/2008 | Aliffi et al. | 382/166 |
| 2008/0215792 A1* | 9/2008 | Jeddeloh | 710/317 |

* cited by examiner

*Primary Examiner*—Paul Dinh
(74) *Attorney, Agent, or Firm*—Bobby K. Truong; Hickman Palermo Truong & Becker LLP

(57) ABSTRACT

Techniques are described which decrease DRC (design rule check) marking time, e.g., in a circuit interconnect router, by capitalizing on repetitious relationships between interconnect elements (and/or circuit components) in a circuit design, by recording previously calculated markings and reusing the markings on subsequent marking iterations or processes. Marking information corresponding to each marking point includes indications of what types of interconnect elements or circuit components can be positioned at the marking point location without violating a design rule. With a dynamic caching process, once the marking computations have been completed for an element and the corresponding points in the vicinity, those values are stored in a cache. The next time the router encounters another instance of a known element-to-point relationship, the stored values are reloaded and applied to the current point.

28 Claims, 4 Drawing Sheets

IDENTIFY AN INSTANCE OF A PARTICULAR SPATIAL RELATIONSHIP, WHEREIN THE INSTANCE CORRESPONDS TO A FIRST CIRCUIT INTERCONNECT ELEMENT AND A FIRST LOCATION ON A CIRCUIT ASSEMBLY DESIGN
202

ACCESS PRE-COMPUTED MARKING INFORMATION CORRESPONDING TO THE PARTICULAR SPATIAL RELATIONSHIP, WHEREIN THE MARKING INFORMATION INDICATES ONE OR MORE TYPES OF INTERCONNECT ELEMENTS THAT CAN BE POSITIONED AT A PARTICULAR LOCATION, RELATIVE TO A FIRST TYPE OF INTERCONNECT ELEMENT TO WHICH THE FIRST INTERCONNECT ELEMENT CORRESPONDS, WITHOUT VIOLATING ONE OR MORE DESIGN RULES ASSOCIATED WITH THE FIRST TYPE OF INTERCONNECT ELEMENT
204

ASSOCIATE IN MACHINE MEMORY THE PRE-COMPUTED MARKING INFORMATION WITH THE INSTANCE OF THE PARTICULAR SPATIAL RELATIONSHIP TO MARK WHAT TYPES OF INTERCONNECT ELEMENTS CAN BE POSITIONED AT THE FIRST LOCATION IN THE CIRCUIT ASSEMBLY DESIGN WITHOUT VIOLATING THE ONE OR MORE DESIGN RULES
206

FIG. 2

COMPUTATIONALLY EFFICIENT DESIGN RULE CHECKING FOR CIRCUIT INTERCONNECT ROUTING DESIGN

FIELD OF THE INVENTION

The present invention relates generally to design of circuits (e.g., printed circuit boards, integrated circuits) and, more specifically, to a computationally efficient technique for design rule check (DRC) processing for circuit interconnect routing design.

BACKGROUND OF THE INVENTION

In the context of electrical/electronic circuit design, interconnect routing (also referred to as "routing") refers to a process of developing a layout of wires and vias to create circuit connections among circuit components. A via is a vertical conductor to connect different layers of a circuit assembly, e.g., a plated through-hole. A wire, or trace, is a horizontal conductor to connect circuit components on a single layer of a circuit assembly. Routing is a very important step in a design flow because this is the step that translates a logical connectivity of a netlist, which describes how circuit elements are logically interconnected, into a physical connectivity by finding the right locations and the right layers on which to place actual conductive interconnections (e.g., wires and vias). The complexity of a routing process is dependent on the size of the design circuit, i.e., the number of gates in the design, and the design area. As the number of gates grows while the design area remains the same or becomes smaller, the complexity of a routing process increases significantly.

A routing engine (also referred to as a "router") refers to an algorithm or a collection of algorithms used to solve the routing problem. There are two main requirements for a routing engine. First, the routing solution must be DRC (design rule check) clean, which means that the wires and vias that are outlined by the router must not violate the relevant design rules. With routing being an iterative process, some design rule violations may be tolerated at intermediate stages of computation; however, the goal of a good router is to ultimately produce a DRC clean design. Such design rules are driven by manufacturing process constraints, which include minimum spacing requirements, minimum size requirements, and other requirements that must be met in order to have a working circuit. Each design rule is typically directed to a particular object type pair, which could be positioned on different layers of a circuit assembly, and where each unique object type is a certain type of circuit component or interconnect element with a corresponding shape and orientation. Second, the router must complete the routing in a reasonable amount of time and, therefore, computational runtime is an important factor. A fast router that can produce a DRC clean solution is the most preferable router.

In general, a routing algorithm comprises two main components: (a) a search engine and (b) a marking engine. The search engine is a component that searches for an available path for each net, where the set of available paths are limited, for example, by manufacturing constraints. The marking engine is a component that verifies the validity of that path against one or more applicable design rules and, effectively, guides the search engine by limiting the possible paths that may be used to connect two or more circuit components. A technique used for guiding the search engine is referred to as "marking." In the past, the search engine was the component that consumed most of the routing runtime. However, with the rapid and significant increase in the number of design rules for newer process technologies, the marking engine has become the main bottleneck in the routing process due to the large number of rules that need to be checked.

Every circuit interconnect element is associated with a corresponding shaped area that the element consumes on a circuit assembly. A traditional approach for performing DRC during a marking phase is by expanding the area required of a given circuit interconnect element to include its required spacing distance (the expanded area is referred to herein as "the violation area") and by marking the violation area for any possibility of violation introduced by another circuit interconnect element if this other element's area overlaps the given element's area. For a given point inside that violation area, several calculations are made for all possible circuit interconnect elements that can be placed at that point. With the rapid increase in the number of vias that can be used in circuit designs, the number of possible circuit interconnect elements for a given point increases accordingly. Thus, the routing runtime could degrade significantly.

In a typical routing process, DRC marking is performed by considering certain points in the vicinity of each circuit interconnect element area and computing a potential DRC violation at each point if a specific circuit interconnect element is placed at that point. Due to the large number of viable points in the vicinity of each element, the router spends a significant amount of time performing the marking process.

Based on the foregoing, there is a need for a faster and more computationally efficient interconnect routing process in the context of circuit design.

SUMMARY OF EMBODIMENTS OF THE INVENTION

Techniques are described which decrease DRC (design rule check) marking time in a circuit interconnect router by capitalizing on repetitious relationships between interconnect elements in a circuit design, by recording previously calculated markings and reusing the markings on subsequent marking iterations or processes. With a dynamic caching process, once the computations have been completed for a circuit interconnect element and the corresponding points in the element's vicinity, those values are stored in a cache. The next time the router encounters another instance of a known circuit interconnect element-to-point relationship, e.g., during the same routing iteration or throughout the entire routing process, the stored values are reloaded and applied to the current point. Similarly, previously computed marking data for a set of known circuit interconnect element-to-point relationships, in association with a known set of design rules, can be stored in persistent storage, e.g., a pre-computed library of marking data. Thus, when a router encounters an instance of one of the known circuit interconnect element-to-point relationships during runtime, the stored marking data is reloaded into memory and applied to the current point.

A non-limiting example of a common use case for the described techniques involves marking in the vicinity of an interconnect wire between two circuit components or junctions. Because a particular spatial relationship, between locations along the wire and respective relative points in the vicinity of the those locations (e.g., based on the minimum spacing required around the wire), repeatedly occurs along the length of the wire, once marking data is computed once for the particular spatial relationship, this marking data can be cached or otherwise saved and applied to each instance of the particular spatial relationship that is encountered along the length of the wire. Consequently, it is not necessary to recompute this marking data for every instance of the particular spatial relationship and the routing process converges and completes significantly faster than if the marking data was repeatedly recomputed, as with prior approaches. With these techniques, CPU time used for computing marking data translates to time to load from cache or persistent storage, which is most likely smaller than the marking computation time. Consequently, the described techniques provide for overall CPU speedup and, therefore, a faster more efficient circuit interconnect routing process.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2 is a flow diagram that illustrates a method involving a circuit interconnect routing design process, according to an embodiment of the invention;

DETAILED DESCRIPTION OF EMBODIMENTS OF THE INVENTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Circuit Interconnect Router Marking

A circuit interconnect routing process is performed after the electronic circuit components have already been laid out for a given circuit design, based in part on a corresponding netlist. The routing process includes routing interconnect elements (e.g., various wires and vias) between the various circuit components. This routing process includes computing marking information associated with various interconnect elements at various points relative to these interconnect elements.

Violation Area

Figure 1A:
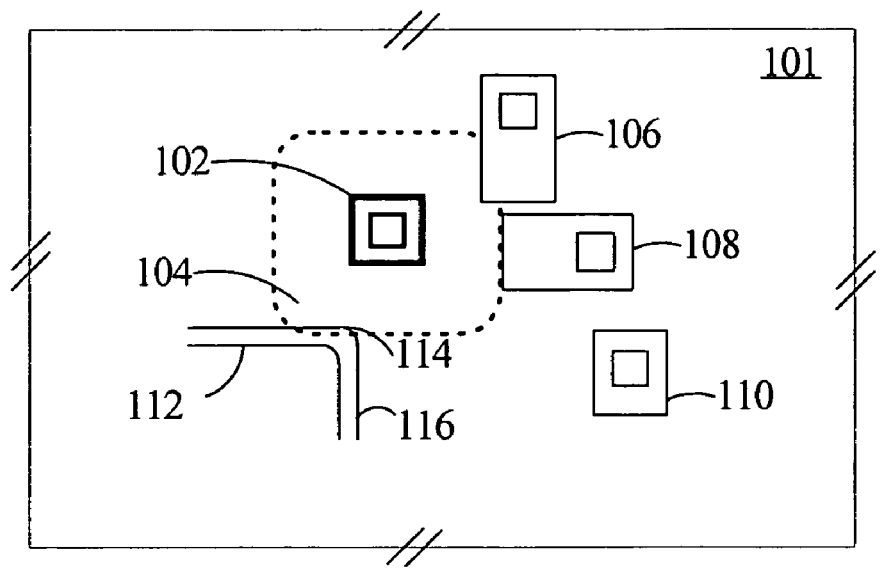
FIG. 1A is a diagram that illustrates a violation area for a via in the context of an interconnect routing design process, according to an embodiment of the invention.

FIG. 1A is a diagram that illustrates a violation area for a via in the context of an interconnect routing design process, for a circuit design 101, according to an embodiment of the invention. FIG. 1A depicts via 102 with a corresponding surrounding violation area 104. Violation area 104 is based on, for example, a design rule specifying the minimum distance between via 102 and any other interconnect element, such as another via or a wire. Hence, if any portion of another interconnect element is positioned within the violation area 104, then the design rule would be violated.

FIG. 1A depicts three other vias with various shapes and orientations: via 106, via 108, and via 110, as positioned on the same circuit assembly layer as via 102. FIG. 1A further depicts a horizontal wire 112, a bend 114, and a vertical wire 116, positioned on the same circuit assembly layer as via 102. The exact position of the respective origins for vias 106, 108, 110 and wires 112, 114, 116 may be constrained, for example, to points in a grid pattern (e.g., gridded routing) or may be freely positioned anywhere on the circuit assembly layer (e.g., non-gridded routing). Regardless of the type of routing process used, via 106, horizontal wire 112 and bend 114 would cause a violation of the design rule associated with via 102 because these elements overlap the violation area 104. Similarly, via 108, via 110, and vertical wire 116 would not cause a violation of the design rule associated with via 102 because these elements do not overlap the violation area 104.

Computing Marking Information, Generally

Figure 1B:
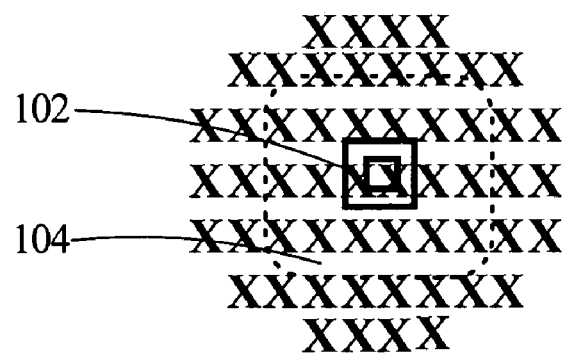
FIG. 1B is a diagram that illustrates marking points for a via in the context of an interconnect routing design process, according to an embodiment of the invention.

FIG. 1B is a diagram that illustrates marking points for a via in the context of an interconnect routing design process, according to an embodiment of the invention. FIG. 1B visually depicts, using multiple 'X's for marking points, an "area of concern" with respect to via 102. Notice that the area of concern expands beyond the violation area 104. This is because, based on the various shapes, orientations, and locations available for all the interconnect elements that may be positioned within the vicinity of via 102 (for a given circuit design domain), if the origin of one or more certain interconnect elements are oriented in a certain direction at a marking point within the area of concern, then the shaped area of the one or more certain elements would encroach on the violation area 104. Therefore, these elements would violate the associated design rule.

Generally, marking information corresponding to a particular spatial relationship between (a) a particular type and orientation of a circuit component or interconnect element and (b) a relative point (referred to hereafter as an element-point pair) comprises a list of interconnect elements that are available for placement at that point, and an indication of whether or not that element would violate one or more design rules if placed at that point in a certain orientation. Additionally, marking information may correspond to a particular spatial relationship between (a) a first particular interconnect element or circuit component (generally, object) with a corresponding particular orientation and (b) a second particular interconnect element or circuit component (generally, object) with a corresponding particular orientation (also referred to as an element-point pair), and indicate whether (i) the secondary object will or will not cause any design rule violation and (ii) whether any connection between these two objects (using vertical or horizontal wires) is allowed.

Storing Previously Computed Marking Information

In order to use previously computed marking information for subsequent routing iterations and/or processes, such marking information is stored for subsequent access, according to an embodiment. According to a related embodiment, once marking information for a particular element-point pair is computed, this marking information is stored in a cache. Thus, in response to subsequent encounters with instances of the same element-point pair, the marking information is retrieved from the cache and applied to the new instances by using the same marking information to mark the vicinity of the new instances. This process is dynamic in that the marking information is computed as new element-point pairs are encountered during a given routing process, cached (e.g., in a routing process specific cache data structure), and accessed from the cache if and when new instances of the element-point pair are encountered.

According to one embodiment, some or all of the marking information is stored in persistent storage in conjunction with or in addition to storing in cache. For example, the cache may become full and require some marking information to be stored in non-volatile storage, or after completing a routing process for a particular portion of a circuit design the marking information is stored in non-volatile storage for access by routing processes associated with other portions of the same circuit design. Furthermore, if there are some element-point pairs known in advance to be common across multiple circuit design domains (e.g., for certain types of circuits or logic, or for certain circuit manufacturing processes, or for certain design tools, and the like), a library of marking information corresponding to such element-point pairs can be pre-computed and stored persistently, for loading into volatile memory as needed.

Thus, the foregoing illustrates that the manner and context in which marking information is stored, accessed, and applied may vary from implementation to implementation.

For a non-limiting example of an implementation, for each element-point pair, O1 and O2, two dynamic cache arrays are created. One array is used for the case where the first primary object O1 is the center of computation while the second array is used for the case where the secondary object O2 is the center of computation. The axes for the arrays are the x-distance and y-distance between the origin of the primary object and the origin of the secondary object which is inside the area of concern of the primary object. The value for each entry in the array is a marking bit indicating whether the secondary object will or will not cause a design rule violation and whether any connection between these two objects (e.g., using a vertical or a horizontal wire) is allowed.

Using Previously Computed Marking Information, Generally

For a given routing process in which two or more circuit components are interconnected in a given circuit assembly design, points within the circuit assembly design and the points' spatial relation to a particular type of circuit component or circuit interconnect element are used to systematically compute marking information associated with the particular type (or instances of the particular type) of component or interconnect element. According to one embodiment, once marking information is computed for a particular element-point pair, this marking information is used to mark other points within the circuit assembly design that are part of a like element-point pair. Such marking information may be used within the same routing process or for different routing processes, and/or within the same or different circuit design (e.g., if the same design rules apply and similar interconnect element types are present in the design). For example, computed marking information can be used for like element-point pairs encountered during the same iteration of the same routing process, during a subsequent iteration of the same routing process, during a routing process of a subsequent circuit design, etc.

Thus, the foregoing illustrates that the manner and context in which previously computed marking information is used may vary from implementation to implementation.

A Method Involving Circuit Interconnect Routing

FIG. 2 is a flow diagram that illustrates a method involving a circuit interconnect routing design process, according to an embodiment of the invention. According to one embodiment, the method illustrated in FIG. 2 is embodied in instructions which, when executed by one or more processors, cause performance of the method. For example, such instructions may be constituent to a computer program executed by the computer system 500 of FIG. 5. According to one embodiment, the method illustrated in FIG. 2 is embodied in instructions embedded in memory of the computer system 500 of FIG. 5 which, when executed, cause performance of the method.

Figure 3:
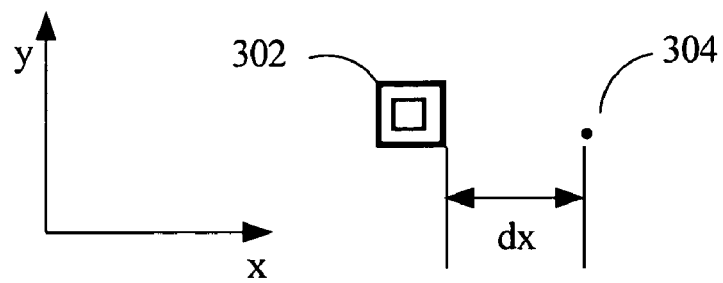
FIG. 3 is a diagram that illustrates an example of a spatial relationship between an interconnect element and a location in a circuit assembly design, according to an embodiment of the invention.

FIG. 3 is a diagram that illustrates an example of a spatial relationship between an interconnect element and a location in a circuit assembly design, according to an embodiment of the invention. FIG. 3 is described in relation to describing the method illustrated in FIG. 2.

The blocks illustrated in FIG. 2 are performed as part of a circuit interconnect routing process, i.e., while executing a routing process for an electrical/electronic circuit design. At block 202, an instance of a particular spatial relationship is identified, where the instance of the spatial relationship corresponds to a first circuit interconnect element and a first location in a circuit assembly design. For example, while a marking engine of an interconnect router is marking a path between an interconnect element 302 (FIG. 3) and another interconnect element or circuit component (not shown), the marking engine recognizes and identifies that the point 304 is a certain distance, dx (in the x direction), from interconnect element 302.

At block 204, in response to identifying the particular spatial relationship (e.g., dx between interconnect element 302 and point 304), previously computed marking information is accessed which corresponds to the particular spatial relationship. As discussed, marking information indicates one or more types of interconnect elements that can be positioned at a particular location relative to a type ("first type") of interconnect element to which the first interconnect element corresponds, without violating one or more design rules associated with the first type of interconnect element. The marking information may be accessed from local process memory, from a process cache, from persistent storage, or some other form of storage. Significantly, the marking engine does not need to recompute the marking information corresponding to this particular spatial relationship because it has already been computed and stored, such as by a previous marking process or otherwise.

For example, during the marking process, the cache could be checked first for marking information corresponding to the spatial relationship between the current element-point pair. If the appropriate marking information has been previously computed, then the marking information can be mapped back to the current location in the circuit design. If, for example, the coordinates in the cache have been normalized to have all object origins relative to the center of the corresponding primary object, then the coordinates for the secondary object from the cache are translated to the corresponding design point. Further, if it is found that the appropriate marking information has not been previously computed and, therefore, is not in the cache, then the marking process could then check non-volatile storage for the appropriate marking information.

Once the previously computed marking information is accessed from memory, at block 206 the previously computed marking information corresponding to the particular spatial relationship is applied to the instance of the particular spatial relationship identified at block 202. For example, applying the marking information refers to associating, in machine memory (e.g., RAM), the previously computed marking information with the instance of the particular spatial relationship identified at block 202, for use by the routing process. Hence, this association effectively "marks" what types of interconnect elements can be positioned at the first location (e.g., point 304 of FIG. 3) in the circuit assembly design without violating the one or more design rules associated with the current interconnect element (e.g., via 302 of FIG. 3), where the one or more design rules are the rules on which the previously computed marking information is based. Furthermore, the marking information may also mark what types of interconnect elements would violate, tolerably and/or untolerably, the one or more design rules associated with the first type of interconnect element if such elements were positioned at the first location. It is conceivable that a design rule is violated by a particular element-point pair, but that such a violation is tolerable and, therefore, a conductive connection between the element and the point is allowed in spite of the violation.

With the use of a marking information cache, at the end of a routing iteration the cache does not need to be destroyed or cleaned up. Because the cache represents a marking scheme between an object pair in general, regardless of the actual location of those two objects in the circuit design, corresponding marking information can be reused for that pair at any place in the design. After several iterations, the cache may have accumulated marking information for all possible element-point pairs that may occur in the design and, therefore, no further computation of marking information is needed. Thereafter, marking runtime speed is increased by substituting computationally expensive calculations with inexpensive look-ups.

Use of Previously Computed Marking Information for a Sequence

Figure 4:
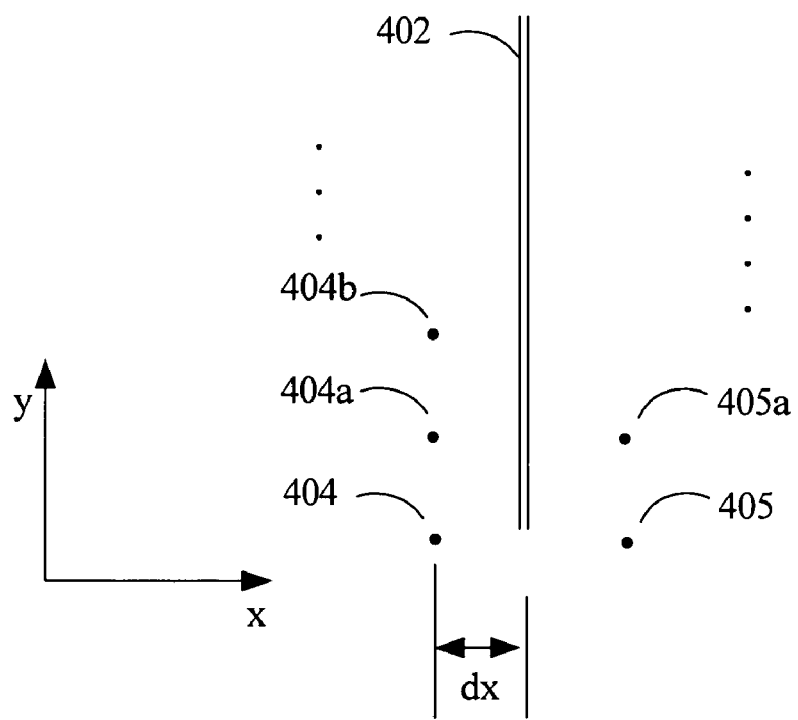
FIG. 4 is a diagram that illustrates an example of a spatial relationship between a wire interconnect element and locations in a circuit assembly design, according to an embodiment of the invention.

As a non-limiting example of the potential benefits to practicing the method illustrated in FIG. 2, use of previously computed marking information in the context of a sequential set of instances of a particular spatial relationship is discussed hereafter. FIG. 4 is a diagram that illustrates an example of a spatial relationship between a wire interconnect element and locations in a circuit assembly design, according to an embodiment of the invention.

FIG. 4 depicts a wire 402 (a particular type of interconnect element) and a point 404 a certain distance, dx (in the x direction), from wire 402. While executing a routing process for a electrical/electronic circuit design, a sequential set of instances of a particular spatial relationship is identified. Similar to the method described in reference to FIG. 2, once the instance of the spatial relationship corresponding to wire 402 and point 404 is identified (e.g., block 202 of FIG. 2), the corresponding marking information can be accessed from storage (e.g., block 204 of FIG. 2) and associated with this instance (e.g., block 206 of FIG. 2).

However, in addition to identifying the spatial relationship between wire 402 and point 404, the marking process recognizes that this particular spatial relationship is repeated along the length of wire 402. Therefore, the marking process identifies a sequential set of instances of the particular spatial relationship, i.e., wire 402 in relation to points 404a, 404b, and so on. Thus, the marking process can apply the marking information corresponding to the spatial relationship between wire 402 and point 404 to all the other like instances, i.e., wire 402 in relation to points 404a, 404b, and so on. Similarly, if the one or more design rules applicable to the type of interconnect element to which wire 402 corresponds are the same for both sides of this type of wire, then the same marking information that corresponds to the spatial relationship between wire 402 and point 404 is applicable to all other like instances. For example, the same marking information is applicable to the spatial relationship between wire 402 in relation to points 405, 405a, and so on. Consequently, a significant amount of computational processing is avoided by applying the previously computed marking information to a sequence of similar spatial relationships along the length of a wire interconnect element rather than recomputing the marking information for each instance of the spatial relationship.

Hardware Overview

Figure 5:
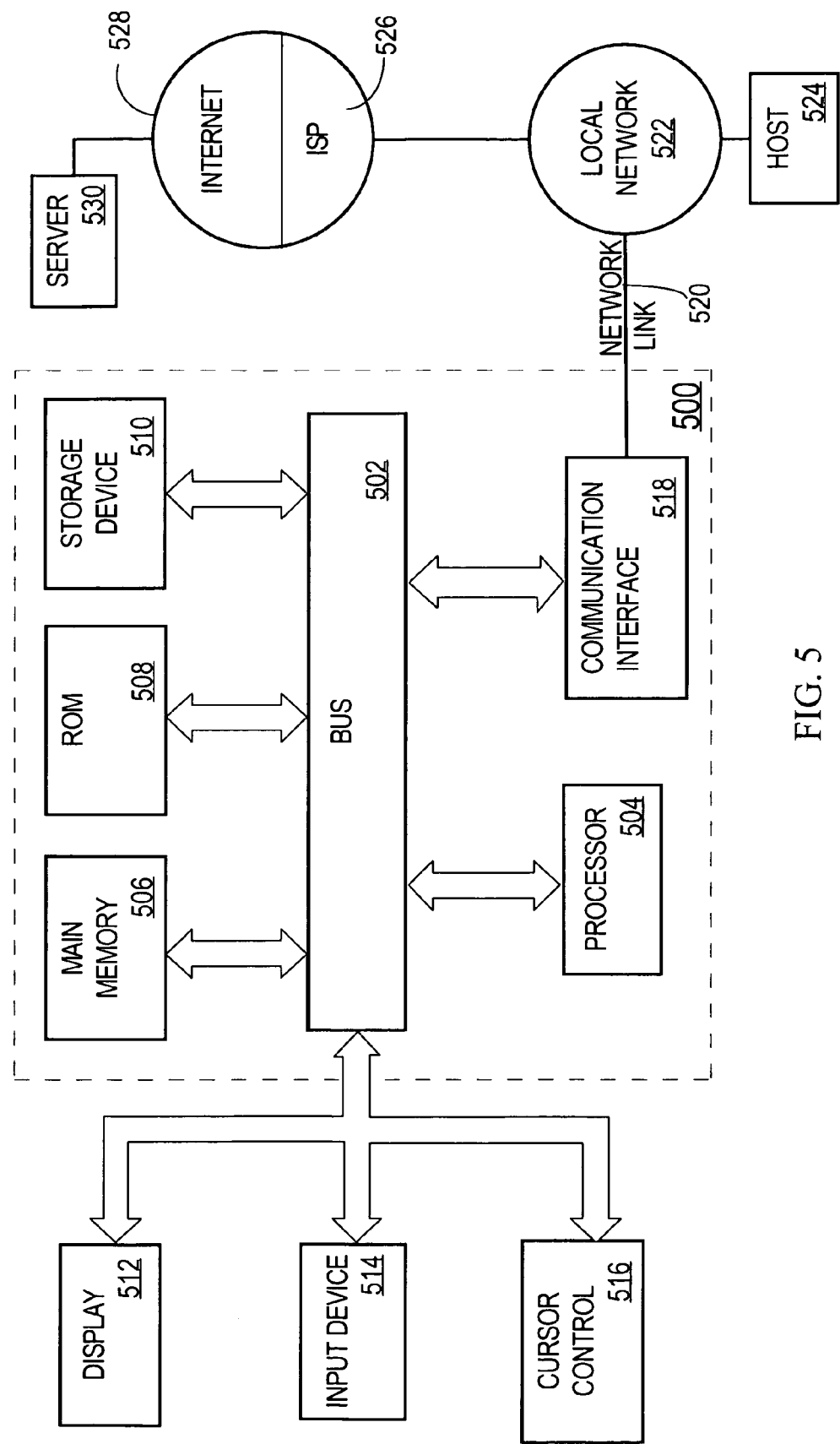
FIG. 5 is a block diagram that illustrates a computer system upon which an embodiment of the invention may be implemented.

FIG. 5 is a block diagram that illustrates a computer system 500 upon which an embodiment of the invention may be implemented. Computer system 500 includes a bus 502 or other communication mechanism for communicating information, and a processor 504 coupled with bus 502 for processing information. Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a cathode ray tube (CRT), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

Embodiments of the invention are related to the use of computer system 500 for implementing the techniques described herein. According to one embodiment of the invention, those techniques are performed by computer system 500 in response to processor 504 executing one or more sequences of one or more instructions contained in main memory 506. Such instructions may be read into main memory 506 from another machine-readable medium, such as storage device 510. Execution of the sequences of instructions contained in main memory 506 causes processor 504 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 500, various machine-readable media are involved, for example, in providing instructions to processor 504 for execution. Such a medium may take many forms, including but not limited to, non-volatile media, volatile media, and transmission media. Non-volatile media includes, for example, optical or magnetic disks, such as storage device 510. Volatile media includes dynamic memory, such as main memory 506. Transmission media includes coaxial cables, copper wire and fiber optics, including the wires that comprise bus 502. Transmission media can also take the form of acoustic or light waves, such as those generated during radio-wave and infra-red data communications. All such media must be tangible to enable the instructions carried by the media to be detected by a physical mechanism that reads the instructions into a machine.

Common forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 504 for execution. For example, the instructions may initially be carried on a magnetic disk of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are exemplary forms of carrier waves transporting the information.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution. In this manner, computer system 500 may obtain application code in the form of a carrier wave.

Extensions and Alternatives

Alternative embodiments of the invention are described throughout the foregoing description, and in locations that best facilitate understanding the context of the embodiments. Furthermore, the invention has been described with reference to specific embodiments thereof. In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps are set forth in a particular order, and alphabetic and alphanumeric labels may be used to identify certain steps. Unless specifically stated in the description, embodiments of the invention are not necessarily limited to any particular order of carrying out such steps. In particular, the labels are used merely for convenient identification of steps, and are not intended to specify or require a particular order of carrying out such steps.

What is claimed is:

1. A computer-implemented method, comprising:

identifying, by a computer, an instance of a particular element-point pair, wherein the particular element-point pair indicates an association between an interconnect element of a first type of interconnect element and a point located at a particular spatial location relative to the interconnect element, and wherein the instance of the particular element-point pair is a particular occurrence of the particular element-point pair involving a first interconnect element of the first type of interconnect element and a first location in a circuit assembly design;

accessing previously computed marking information corresponding to the particular element-point pair, wherein the previously computed marking information comprises information indicating one or more types of interconnect elements that can be positioned at the particular spatial location without violating a set of one or more design rules applicable to the first type of interconnect element; and associating in machine memory the previously computed marking information with the instance of the particular element-point pair such that the previously computed marking information is associated with the first location in the circuit assembly design without having to recompute the previously computed marking information.

2. The method of claim 1, wherein identifying, accessing, and associating are performed while performing an interconnect routing design process to route an interconnect between two or more elements of the circuit assembly design.

3. The method of claim 1, wherein identifying, accessing, and associating are performed while performing a design rule check (DRC) process associated with a circuit assembly design.

4. The method of claim 1, wherein accessing previously computed marking information includes accessing the previously computed marking information from a cache.

5. The method of claim 1, wherein accessing previously computed marking information includes accessing the previously computed marking information from a cache that is associated exclusively with an interconnect routing design process.

6. The method of claim 1, further comprising:

prior to identifying the instance of the particular element-point pair, identifying an initial instance of the particular element-point pair involving a second interconnect element of the first type of interconnect element and a second location in the circuit assembly design; and in response to identifying the initial instance of the particular element-point pair:

computing, based at least in part on the initial instance, marking information that comprises information indicating one or more types of interconnect elements that can be positioned at the particular spatial location without violating the set of one or more design rules applicable to the first type of interconnect element; and storing the marking information for subsequent use as the previously computed marking information.

7. The method of claim 1, wherein accessing previously computed marking information includes accessing the previously computed marking information from persistent storage.

8. The method of claim 6, wherein the marking information is stored in a cache or in persistent storage.

9. The method of claim 1, further comprising:
identifying a sequential set of instances of the particular element-point pair;
wherein each instance of the particular element-point pair, from the sequential set, corresponds to (a) a portion of a second interconnect element corresponding to the first type of interconnect element and (b) a respective location in the circuit assembly design; and
associating in machine memory the previously computed marking information with each instance from the sequential set of instances of the particular element-point pair.

10. The method of claim 1, wherein the first interconnect element comprises a signal trace.

11. The method of claim 1, wherein the first interconnect element comprises a via.

12. The method of claim 1, wherein the previously computed marking information includes, for each particular type of interconnect element from a plurality of types of interconnect elements, (a) an indication of whether the particular type of interconnect element would violate a design rule associated with the first type of interconnect element, and (b) whether a conductive connection is allowed between (i) the first interconnect element and (ii) an element of the particular type of interconnect element.

13. The method of claim 1, wherein the first interconnect element is on a first layer represented in the circuit assembly design and the first location is on a second layer represented in the circuit assembly design, and wherein the second layer is a different layer from the first layer.

14. The method of claim 1, wherein the previously computed marking information is a first previously computed marking information corresponding to a first set of one or more design rules, and wherein accessing previously computed marking information includes accessing the first previously computed marking information from a stored set of previously computed marking information, the method further comprising:
while performing a circuit interconnect routing design process,
accessing, from the stored set of previously computed marking information, second previously computed marking information corresponding to the particular element-point pair;
wherein the second previously computed marking information indicates one or more types of interconnect elements that can be positioned at the particular spatial location without violating a second set of one or more design rules associated with the first type of interconnect element, and wherein the second set of one or more design rules is different from the first set of one or more design rules; and
associating in machine memory the second previously computed marking information with a second instance of the particular element-point pair.

15. A machine-readable storage medium carrying one or more sequences of instructions which, when executed by one or more processors, causes performance of the method recited in claim 1.

16. A computer-implemented method, comprising:
while performing a design rule check (DRC) process associated with a circuit assembly design,
identifying, by a computer, an instance of a particular element-point pair, wherein the particular element-point pair indicates an association between a circuit element of a first type of circuit element and a point located at a particular spatial location relative to the circuit element, and wherein the instance of the particular element-point pair is a particular occurrence of the particular element-point pair involving a first circuit element of the first type of circuit element and a first location in the circuit assembly design;
accessing previously computed marking information corresponding to the particular element-point pair, wherein the previously computed marking information comprises information indicating one or more types of circuit elements that can be positioned at the particular spatial location without violating a set of one or more design rules applicable to the first type of circuit element; and
associating in machine memory the previously computed marking information with the instance of the particular element-point pair such that the previously computed marking information is associated with the first location in the circuit assembly design without having to recompute the previously computed marking information.

17. The method of claim 16, wherein accessing previously computed marking information includes accessing the previously computed marking information from a cache.

18. The method of claim 16, further comprising:
prior to identifying the instance of the particular element-point pair, identifying an initial instance of the particular element-point pair involving a second circuit element of the first type of circuit element and a second location in the circuit assembly design; and
in response to identifying the initial instance of the particular element-point pair:
computing, based at least in part on the initial instance, marking information that comprises information indicating one or more types of circuit elements that can be positioned at the particular spatial location without violating the set of one or more design rules applicable to the first type of circuit element, and
storing the marking information for subsequent use as the previously computed marking information.

19. A machine-readable storage medium carrying one or more sequences of instructions which, when executed by one or more processors, causes performance of the method recited in claim 16.

20. A system comprising:
one or more processors; and
one or more stored sequences of instructions which, when executed by the one or more processors, cause the one or more processors to perform the operations of:
identifying an instance of a particular element-point pair, wherein the particular element-point pair indicates an association between an interconnect element of a first type of interconnect element and a point located at a particular spatial location relative to the interconnect element, and wherein the instance of the particular element-point pair is a particular occurrence of the particular element-point pair involving a first interconnect element of the first type of interconnect element and a first location in a circuit assembly design;
accessing previously computed marking information corresponding to the particular element-point pair, wherein the previously computed marking information comprises information indicating one or more types of interconnect elements that can be positioned at the particular spatial location without violating a set of one or more design rules applicable to the first type of interconnect element; and associating in machine memory the previously computed marking information with the instance of the particular element-point pair such that the previously computed marking information is associated with the first location in the circuit assembly design without having to recompute the previously computed marking information.

21. The system of claim 20, wherein identifying, accessing, and associating are performed while performing an interconnect routing design process to route an interconnect between two or more elements of the circuit assembly design.

22. The system of claim 20, wherein identifying, accessing, and associating are performed while performing a design rule check (DRC) process associated with a circuit assembly design.

23. The system of claim 20, wherein accessing previously computed marking information includes accessing the previously computed marking information from a cache that is associated exclusively with an interconnect routing design process.

24. The system of claim 20, wherein the one or more stored sequences of instructions, when executed by the one or more processors, cause the one or more processors to further perform the operations of:

prior to identifying the instance of the particular element-point pair, identifying an initial instance of the particular element-point pair involving a second interconnect element of the first type of interconnect element and a second location in the circuit assembly design; and in response to identifying the initial instance of the particular element-point pair:

computing, based at least in part on the initial instance, marking information that comprises information indicating one or more types of interconnect elements that can be positioned at the particular spatial location without violating the set of one or more design rules applicable to the first type of interconnect element; and storing the marking information in a cache for subsequent use as the previously computed marking information.

25. The system of claim 20, wherein the one or more stored sequences of instructions, when executed by the one or more processors, cause the one or more processors to further perform the operations of:

identifying a sequential set of instances of the particular element-point pair;

wherein each instance of the particular element-point pair, from the sequential set, corresponds to (a) a portion of a second interconnect element corresponding to the first type of interconnect element and (b) a respective location in the circuit assembly design; and associating in machine memory the previously computed marking information with each instance from the sequential set of instances of the particular element-point pair.

26. A computer program product embodied on a machine-readable storage medium which, when executed by one or more processors, causes at least the following operations to be performed:

identifying an instance of a particular element-point pair, wherein the particular element-point pair indicates an association between a circuit element of a first type of circuit element and a point located at a particular spatial location relative to the circuit element, and wherein the instance of the particular element-point pair is a particular occurrence of the particular element-point pair involving a first circuit element of the first type of circuit element and a first location in a circuit assembly design;

accessing previously computed marking information corresponding to the particular element-point pair, wherein the previously computed marking information comprises information indicating one or more types of circuit elements that can be positioned at the particular spatial location without violating a set of one or more design rules applicable to the first type of circuit element; and associating in machine memory the previously computed marking information with the instance of the particular element-point pair such that the previously computed marking information is associated with the first location in the circuit assembly design without having to recompute the previously computed marking information.

27. The computer program product of claim 26, wherein the computer program product further causes at least the following operations to be performed:

prior to identifying the instance of the particular element-point pair, identifying an initial instance of the particular element-point pair involving a second circuit element of the first type of circuit element and a second location in the circuit assembly design; and in response to identifying the initial instance of the particular element-point pair:

computing, based at least in part on the initial instance, marking information that comprises information indicating one or more types of circuit elements that can be positioned at the particular spatial location without violating the set of one or more design rules applicable to the first type of circuit element; and storing the marking information for subsequent use as the previously computed marking information.

28. The computer program product of claim 26, wherein the computer program product further causes at least the following operations to be performed:

identifying a sequential set of instances of the particular element-point pair;

wherein each instance of the particular element-point pair, from the sequential set, corresponds to (a) a portion of a second circuit element corresponding to the first type of circuit element and (b) a respective location in the circuit assembly design; and associating in machine memory the previously computed marking information with each instance from the sequential set of instances of the particular element-point pair.

* * * * *